United States Patent [19]

Amos et al.

[11] Patent Number: 5,094,381
[45] Date of Patent: Mar. 10, 1992

[54] SYSTEM FOR AUTOMATED MOUNTING OF ELECTRONIC COMPONENTS TO CIRCUIT BOARDS

[75] Inventors: Robert A. Amos; Joel R. Anstrom; Francis W. Bogaczyk; Robert W. Kulterman, all of Austin; Gilbert B. Nebgen, Round Rock; Darryl R. Polk; Michael A. Rubsam, both of Austin; David P. Watson, Round Rock; Terry L. Wilmoth, Austin; Clifford M. Wood, Round Rock, all of Tex.

[73] Assignee: International Business Machines Corporation, Armonk, N.Y.

[21] Appl. No.: 616,150

[22] Filed: Nov. 20, 1990

[51] Int. Cl.$^5$ .................... B23K 11/25; B23K 3/047
[52] U.S. Cl. .......................... 228/6.2; 228/9; 228/42; 219/85.18
[58] Field of Search .............. 228/9, 105, 102, 42, 228/6.2; 219/85.16, 85.18, 85.19

[56] References Cited

U.S. PATENT DOCUMENTS

| | | | |
|---|---|---|---|
| 3,230,338 | 1/1966 | Kawecki | 219/85.16 |
| 3,790,738 | 2/1974 | Laub et al. | 228/6.2 |
| 4,603,802 | 8/1986 | Kurtz et al. | 228/102 |
| 4,715,526 | 12/1987 | MacNeil | 228/6.2 |
| 4,887,758 | 12/1989 | Suzuki et al. | 228/6.2 |

FOREIGN PATENT DOCUMENTS 0337065 10/1989 European Pat. Off. ............. 228/9

OTHER PUBLICATIONS

*IBM Technical Disclosure Bulletin,* vol. 31, No. 10, Mar. 1989, pp. 222–228.

*Primary Examiner*—Richard K. Seidel
*Assistant Examiner*—Jeffrey T. Knapp
*Attorney, Agent, or Firm*—Andrew J. Dillon

[57] ABSTRACT

The apparatus of the present invention may be utilized for the automated bonding of electronic components to a circuit board. A placement and bonding head is attached to a manipulatable robotic arm and is utilized to select an electronic component having a plurality of conductive leads from a supply of such components and position that component adjacent a plurality of contact pads on a circuit board. While retaining the electronic component within the placement and bonding head, the component is then thermally bonded to the contact pads. In one embodiment of the present invention, an electronic component may be optically inspected while being retained within the placement and bonding head. In another embodiment, thermal bonding is accomplished utilizing a plurality of thermally activatable blades which each include a thermocouple mounted adjacent thereto. Selective low current control signals are then coupled to the placement and bonding head where transformers are utilized to amplify the current prior to coupling the control signal to individually thermally activatable blades. In yet another embodiment of the present invention, the placement and bonding head includes a plenum for supplying inert gas to the bonding site so that the use of flux is not necessary.

12 Claims, 3 Drawing Sheets

SYSTEM FOR AUTOMATED MOUNTING OF ELECTRONIC COMPONENTS TO CIRCUIT BOARDS

BACKGROUND OF THE INVENTION

1. Technical Field

The present invention relates in general to the field of manufacturing electronic systems and in particular to a system for the automated manufacture of electronic systems. Still more particularly the present invention relates to systems for the automated placement and bonding of electronic components on circuit boards utilizing robotic manipulators.

2. Description of the Related Art

The increasing complexity of electronic systems and the concomitant increase in component density within such systems has lead to an increased use of robotic assisted manufacturing in the assembly and testing of electronic systems. It is common in the prior art to utilize robotic systems to select an electronic component from a supply of such components and place that component into a test fixture or jig where it may be optically examined to determine proper orientation and whether or not all conductive leads for that component are present and properly aligned.

Next, an electronic component manipulator is generally utilized to remove the component from the test fixture and place that component on a circuit board where it is maintained in position by utilization of a tacky substance, such as flux. Thereafter, a bonding tool of some sort is generally utilized to thermally bond the conductive leads of the electronic component to presoldered contact pads which are disposed on the circuit board.

The utilization of robotic systems for the placement and bonding of electronic components on a circuit board in an electronic system is a great improvement over the manual mounting of such components. The accuracy and efficiency of robotic systems for utilization in activities which require repetitive movements is quite well known. However, the automated placement and bonding of electronic components onto a circuit board gives rise to a possible problem in quality assurance which is due to the multiplicity of steps of the manufacturing process described above and the possibility that the conductive leads of an electronic component may be damaged or misaligned during one or more of the steps described above which require the component to be moved. Therefore, an automated process, such as the system described above, may suffer from additional defects or may require a substantially increased inspection program to ensure that all of the electronic components are properly placed on the circuit board, with all conductive leads properly aligned and undamaged.

It should therefore be apparent that a need exists for a system whereby an electronic component may be placed at a selected location on a circuit board and bonded into place while being maintained within the placement head, so that possible damage to the conductive leads of the electronic component is minimized. Further, the varying dimensions and types of electronic components utilized in complex modern electronic systems require that a placement and bonding system which may be utilized to assemble such systems be capable of handling multiple different configurations of electronic components. To this end, it is desirable that such a system be modifiable to assemble systems utilizing many different types of electronic components without the necessity of substantially altering the system.

SUMMARY OF THE INVENTION

It is therefore one object of the present invention to provide an improved system for manufacturing electronic systems.

It is another object of the present invention to provide an improved system for the automated manufacture of electronic systems which permits multiple different types of electronic components to be utilized.

It is still another object of the present invention to provide a system which permits the automatic placement and bonding of multiple types of electronic components on a circuit board utilizing robotic manipulators.

The foregoing objects are achieved as is now described. The apparatus of the present invention may be utilized for the automated bonding of electronic components to a circuit board. A placement and bonding head is attached to a manipulatable robotic arm and is utilized to select an electronic component having a plurality of conductive leads from a supply of such components and position that component adjacent a plurality of contact pads on a circuit board. While retaining the electronic component within the placement and bonding head, the component is then thermally bonded to the contact pads. In one embodiment of the present invention, an electronic component may be optically inspected while being retained within the placement and bonding head. In another embodiment, thermal bonding is accomplished utilizing a plurality of thermally activatable blades which each include a thermocouple mounted adjacent thereto. Selective low current control signals are then coupled to the placement and bonding head where transformers are utilized to amplify the current prior to coupling the control signal to individually thermally activatable blades. In yet another embodiment of the present invention, the placement and bonding head includes a plenum for supplying inert gas to the bonding site so that the use of flux is not necessary.

BRIEF DESCRIPTION OF THE DRAWING

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
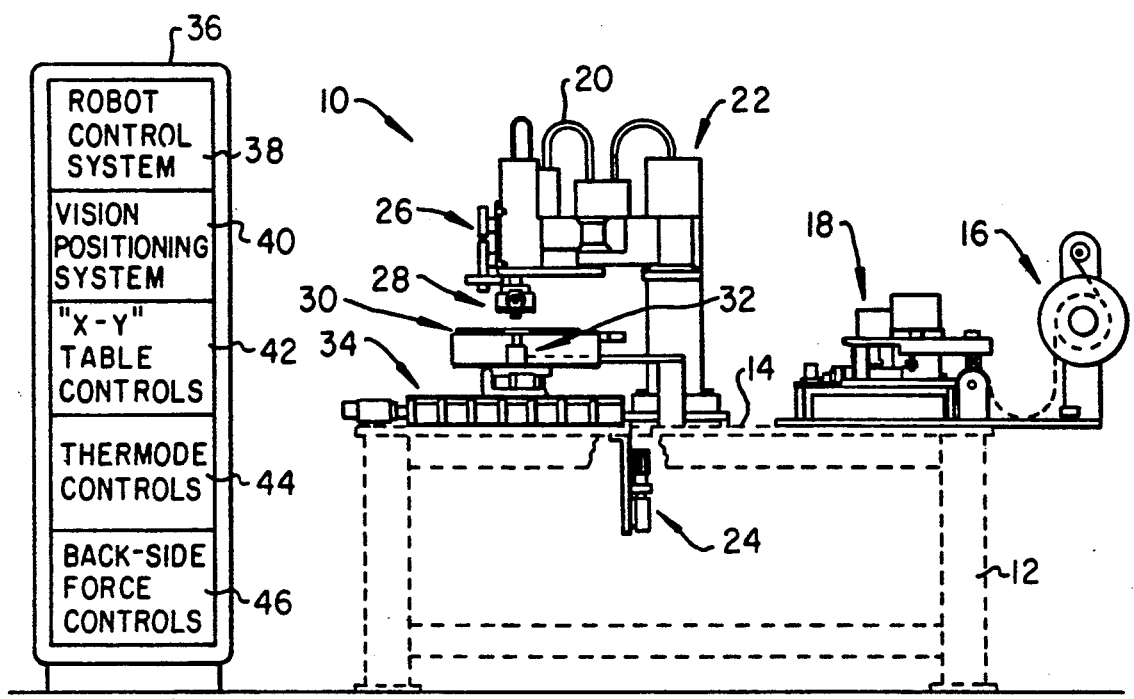
FIG. 1 is a side view of the electronic component placement and bonding system of the present invention.

With reference now to the figures and in particular with reference to FIG. 1, there is depicted a side view of electronic component placement and bonding system 10 of the present invention. As is illustrated, electronic component placement and bonding system 10 is mounted on a base 12, which serves to support a work surface 14. Mounted to the upper surface of work surface 14 is a tape reel 16, which, in one embodiment of the present invention, is utilized to dispense a plurality of so-called "TAB" devices. TAB or "Tape Automated Bonding" devices are electronic components mounted to a continuous tape and which are typically utilized in automated placement and bonding systems of the type disclosed herein.

A tape containing a plurality of electronic devices is preferably fed from tape reel 16 to excise and form tool 18. Excise and form tool 18 is preferably utilized to sever an individual electronic component from the tape contained within tape reel 16 and form the conductive leads associated with that electronic component into an appropriate shape. It is a common practice in the excise and forming of TAB components from a tape to form the conductive leads of each electronic component into a "S" shape so that the component body is elevated above the circuit board or planar member to which it will be mounted. Similarly, it is also common to excise a component from a continuous tape while permitting a bar of polyimide to remain across the ends of the conductive leads. This bar serves to keep the conductive leads at the correct spacing and prevents leads from bending. Either of these two methods may be utilized to protect or form the conductive leads of an electronic component as it is excised from the tape contained on tape reel 16 by excise and form tool 18.

Next, robotic arm 20, which is mounted to robotic arm pivot post 22, may be utilized to manipulate placement and bonding head 28 to the vicinity of excise and form tool 18 to grasp an individual electronic component for mounting, in accordance with the method of the present invention. In one disclosed embodiment of the present invention each individual electronic component which is grasped from excise and form tool 18 by placement and bonding head 28 is positioned directly above inspection camera 24. Inspection camera 24 may be utilized, in a manner well known in the optical scanning art, to visually inspect an electronic component and its conductive leads while it is retained within placement and bonding head 28, to ensure that the electronic component is in a proper orientation and that all conductive leads are present and undamaged.

Thereafter, placement camera 26 is utilized in conjunction with robotic arm 20 to place an electronic component at a desired location above circuit board 30. Circuit board 30 is preferably mounted within a frame above a support device 32, which is utilized to provide support to the underside of circuit board 30 during the administration of the heat and pressure which are necessary to thermally mount an electronic component to circuit board 30.

Individual electronic components may be mounted at multiple locations on circuit board 30 by selectively altering the position of circuit board 30 by means of X-Y Table 34. An X-Y table, such as X-Y Table 34, is commonly utilized in this art to accurately position a circuit board such that an electronic component may be mounted at a desired location. Those skilled in the art will appreciate that by manipulating the position of X-Y Table 34, as well as placement and bonding head 28, an electronic component may be accurately and efficiently placed at any location within circuit board 30.

Still referring to FIG. 1, an electronics rack 36 is schematically represented therein. Electronics rack 36 preferably serves to mount the various subsystems of electronic control circuitry which are utilized to control the various activities described above. For example, robot control system 38 may be utilized to direct robotic arm 20 and placement and bonding head 28 through the various ranges of motion which are necessary to permit placement and bonding head 28 to grasp a component from excise and form tool 18 and place that component at a desired location on circuit board 30.

Also included within electronics rack 36 is vision positioning system circuitry 40. Vision positioning system circuitry 40 is preferably utilized in conjunction with a scanning algorithm and inspection camera 24 and placement camera 26 to ensure that an electronic component is properly oriented, that all of its conductive leads are present and undamaged and that the component is positioned at a desired location on circuit board 30. This is typically accomplished by utilizing various known reference points or fiducials which are located on circuit board 30, at a known relative direction and distance from a desired mounting point and which are programmed into the system.

Electronics rack 36 also preferably includes X-Y Table control circuitry 42. X-Y Table control circuitry is preferably utilized to control the movements of X-Y Table 34 in a manner well known in this art which permits a component to be accurately positioned at a desired location on circuit board 30.

Next, thermode control circuitry 44 is also illustrated as being mounted within electronics rack 36. Thermode control circuitry 44 is utilized, in accordance with an important feature of the present invention, to permit the individually thermally activatable blades of placement and bonding head 28 to be accurately controlled in a manner which ensures thorough bonding of an electronic component to a plurality of contact pads disposed within circuit board 30. The nature of the individual control of each thermally activatable blade within placement and bonding head 28 will be disclosed in greater detail herein.

Finally, back side force control circuitry 46 is also mounted within electronics rack 36. Back side force control circuitry 46 is preferably utilized to selectively activate support 32 beneath circuit board 30 to provide support so that circuit board 30 may endure the necessary forces and pressures which are typically utilized to thermally bond an electronic component to circuit board 30. One example of a system for supporting a circuit board 30 in the manner generally illustrated herein may be seen in U.S. patent application Ser. No. 07/616152, entitled "Method and Apparatus for Circuit Board Support During Component Mounting," which is filed of even date herewith and assigned to the assignee hereof.

Figure 2:
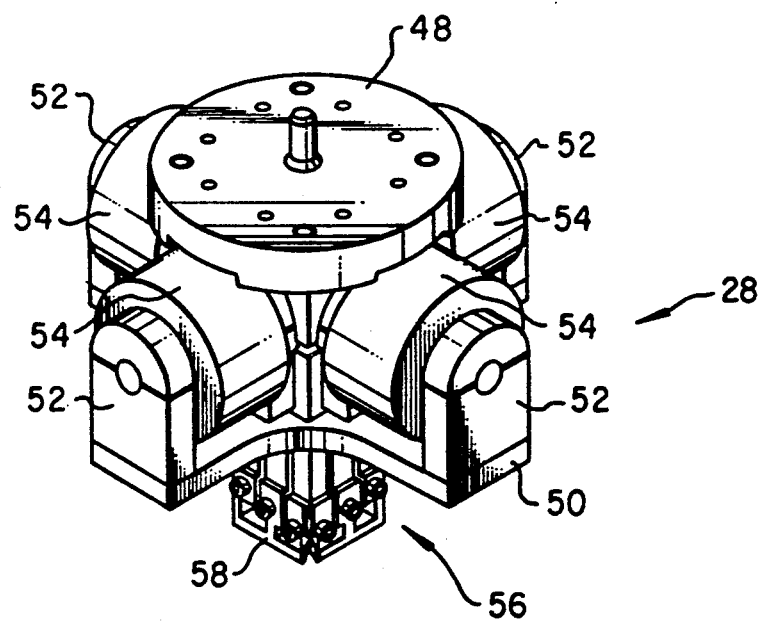
FIG. 2 is a perspective view of the placement and bonding head of the system of FIG. 1.

Referring now to FIG. 2, there is depicted a perspective view of placement and bonding head 28 of the system of FIG. 1. As is illustrated, placement and bonding head 28 includes a housing 50 which is preferably constructed of brass and which includes four brass inner arms 52, which are each mounted at one end to a polycarbonate insulator core 48. In accordance with an important feature of the present invention, each arm of housing 50 is utilized to form a single loop electrical path which, in conjunction with four transformer coils 54, form four independent alternating current transformers.

In this manner, as will be explained in greater detail herein, placement and bonding head 28 may be constructed such that it may be readily and easily mounted or dismounted to robotic arm 20 (see FIG. 1) without the necessity of providing high current connections. By providing a high voltage, low current connection to placement and bonding head 28 and then utilizing the individual transformers formed by each transformer coil 54 and its associated housing arm, the control signals thus applied may be simply and easily converted to a low voltage, high current drive signal which may then be utilized to activate individual thermally activatable blades 58 of thermode assembly 56.

By utilizing brass housing 50 and brass housing arms 52 as both the physical mounting surfaces for thermally activatable blades 58, and as a single turn secondary for the transformers formed utilizing transformer coils 54, several advantageous benefits are obtained. Those skilled in the art will appreciate that in order to quickly and efficiently transfer heat from thermally activatable blades 58 to the component leads to be bonded it is desirable to have no thermal, and consequently no electrical resistance between the component leads and the thermally activatable blades 58.

Without electrical insulation the voltage drop across the bottom of each thermally activatable blade 58 must necessarily be less than a single diode drop in order to prevent forward biasing and perhaps damaging an electronic component being bonded. Thus, a maximum limit of 0.5 volt across the bottom of each thermally activatable blade is desired. By utilizing a 30:1 turns ratio in each transformer which is formed by a housing arm 52 and a transformer coil 54, a nominal 30 volt primary loop drive voltage is converted to a 1 volt secondary loop voltage in each thermally activatable blade 58.

Half of this secondary loop voltage (0.5 volt) is seen across the vertical legs of each thermally activatable blade 58 and the other half of the voltage is seen across the bottom of each thermally activatable blade 58 which is in contact with the conductive leads of an electronic component contained within placement and bonding head 28. Each transformer thus formed is also capable of simultaneously increasing the nominal primary control current of 5 amperes to 150 amperes of current which may be applied to thermally activatable blades 58. Those skilled in the art will appreciate that this is a sufficient source of power to heat a thermally activatable blade to the level necessary for component bonding.

Additionally, the utilization of housing arms 52 and transformer coils 54 to form four current amplification circuits within placement and bonding head 28 provides a method of impedance matching between the low impedance of thermally activatable blades 58 and the drive transistors which are utilized to supply a control voltage to the primary windings of the resultant transformers. This technique is much less costly than utilizing high current drive transistors as would be necessary if the high currents to be applied to thermally activatable blades 58 were to be controlled directly, without the utilization of transformers.

Another advantage of the system described herein is the ability of the system to easily and automatically exchange placement and bonding head 28 for a different placement and bonding head suitable for utilization with a different electronic component. By forming four transformers each utilizing a housing arm 52 and a transformer coil 54 and mounting the resultant transformer to placement and bonding head 28, the transformers are then housed as an integral part of placement and bonding head 28. Thus, the connection between placement and bonding head 28 and robotic arm 20 need only be capable of handling a low current control signal, which results in a much less laborious interconnection between these two devices.

Another advantage of the system described herein is the capability of this system to provide fast temperature cycle time. The amount of time necessary to achieve a desired temperature at each thermally activatable blade 58, hold that temperature steady while thermal bonding occurs and then cool each thermally activatable blade so that placement and bonding head 28 may be lifted and utilized to mount another component is substantially decreased due to the utilization of massive brass housing 50 and housing arms 52, which act as thermal heat sinks which conduct heat away from thermally activatable blades 58. Thermally activatable blades 58 are preferably constructed utilizing a titanium type material and have a much lower thermal capacity than housing 50 and housing arms 52. This thermal heat sink capability permits a very fast cycle time up to operating temperature and back to a cooled level so that a subsequent component may be mounted.

Figure 3:
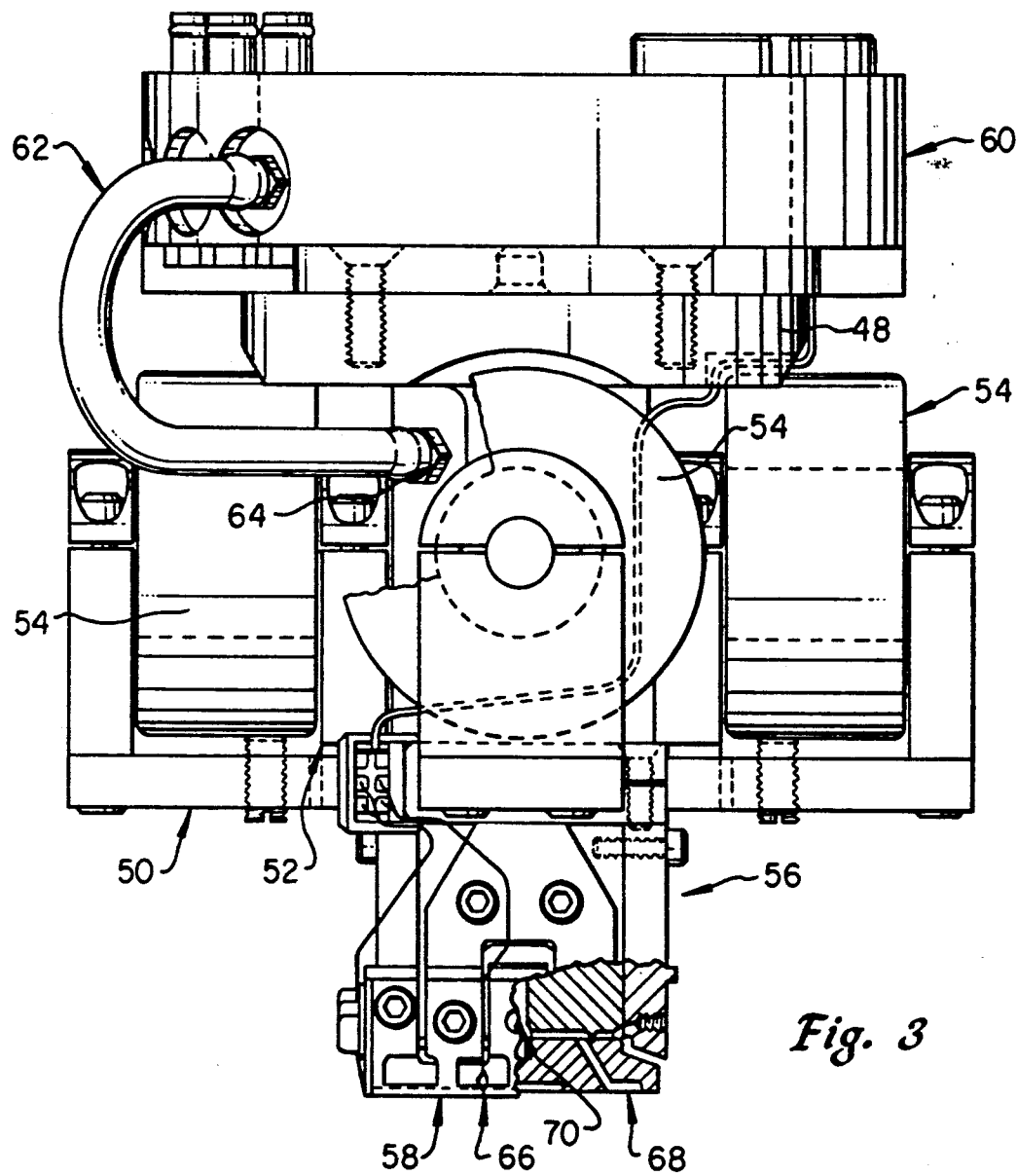
FIG. 3 is a partially cut away view of the placement and bonding head of FIG. 2.

With reference now to FIG. 3, there is depicted a partially cut away view of placement and bonding head 28 of FIG. 2 which may be utilized to illustrate additional details of this device. As is illustrated, placement and bonding head 28 is preferably mounted to a standard commercially available tool changer 60. One example of such a tool changer is the Model Iota tool changer manufactured by Applied Rotobotics, Inc. By utilizing tool changer 60, placement and bonding head 28 may be rapidly and efficiently interchanged with other forms of placement and bonding head 28 to permit different electronic components to be automatically bonded to a circuit board during an assembly operation. An insulator core 48 is preferably constructed of a polycarbonate type material and is utilized to insulate placement and bonding head 28 from robotic arm 20.

A vacuum hose 62 is preferably provided from tool changer 60 to placement and bonding head 28 where it is connected to vacuum fitting 64. Those skilled in the art will appreciate that a vacuum pump which provides a vacuum of approximately twenty inches of mercury may be utilized to permit the selective mounting and retaining of an electronic component within placement and bonding head 28. Control circuitry and an appropriate vacuum pump for such an application may be provided utilizing any commercially available system.

As is illustrated in greater detail in FIG. 3, a brass housing 50 is provided having multiple housing arms 52 which are utilized to form the single turn secondary of four transformers, which are constructed utilizing toroidal transformer coils 54. In a preferred embodiment of the present invention, each transformer coil 54 is preferably a center tapped toroidal coil having sixty turns so that the turns ratio of primary to secondary within the resultant transformer is 30:1.

As is illustrated, thermode 56 is formed at the bottom of placement and bonding head 28 and preferably includes four thermally activatable blades 58. As discussed above, thermally activatable blades 58 are preferably constructed of titanium and are heated, utilizing the output of each transformer formed by a housing arm 52 and a transformer coil 54, to a temperature of approximately two hundred and fifty degrees Centigrade, so that an electronic component may be thermally bonded to a plurality of presoldered contact pads on a circuit board. As is illustrated, thermode 56 preferably includes a vacuum chuck 68, which comprises multiple apertures which couple a cavity in the lower end of thermode 56 to a vacuum channel 70 contained therein. Vacuum is preferably supplied to thermode 56 by means of vacuum hose 62, as described above. By selectively controlling the application of vacuum to thermode 56, via vacuum hose 62, a component disposed beneath thermode 56 may be selectively and temporarily retained in the cavity formed at the lower surface of thermode 56, surrounded by four thermally activatable blades 58.

In accordance with another important feature of the present invention, each thermally activatable blade 58 includes a thermal detector, such as thermocouple 66. Each thermocouple 66 is preferably an iron/constantan thermocouple which is welded to each thermally activatable blade 58 to provide temperature feedback to the control system. The output of each thermocouple 66, the primary coil windings of each transformer formed by a transformer coil 54 and the necessary vacuum hosing are preferably coupled to the lower half of tool changer 60, so that placement and bonding head 28 may be rapidly and efficiently interchanged with similar devices.

Referring again to thermocouple 66, the system of the present invention utilizes an individual thermocouple 66 in association with each thermally activatable blade 58, so that the amount of power applied to each thermally activatable blade 58 may be independently controlled. By controlling each thermally activatable blade 58 independently, a temperature uniformity problem which has arisen in the past is eliminated.

In prior art thermal blade bonding systems without individual control for each thermally activatable blade it is possible to have a problem with consistent bonding due to the fact that one thermally activatable blade may experience a different thermal load than a second thermally activatable blade. Such differences in thermal loads may arise due to differing lead counts for different blades; nonplanarity between an individual thermally activatable blade and the conductive leads disposed adjacent thereto; varying oxidation and contamination levels between a thermally activatable blades and conductive leads; variations in solder height; and, different panel interplane loads. By separately controlling each thermally activatable blade 58 within thermode 56, the system of the present invention ensures that a blade with a lower thermal load will not overheat and damage a circuit board while a second blade with a higher thermal load will get sufficient electrical power applied thereto to reach the temperature necessary for proper bonding.

Figure 4:
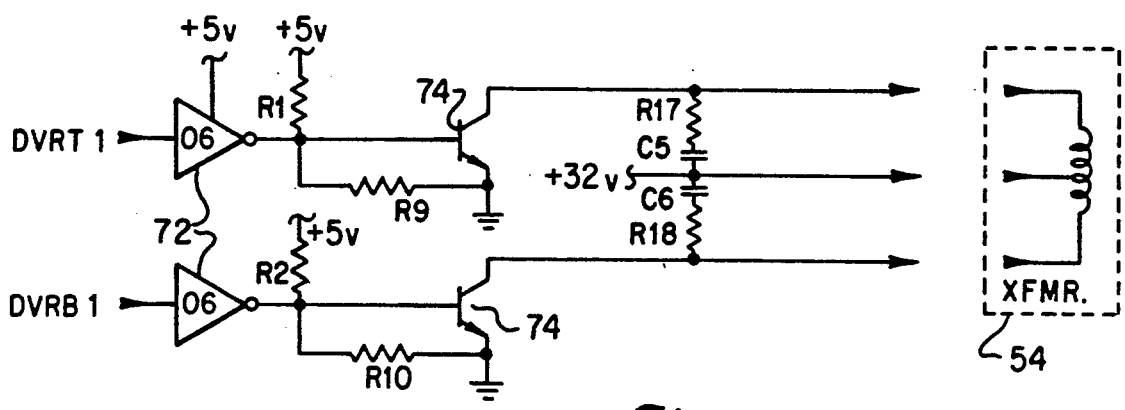
FIG. 4 is a schematic view of the control circuitry utilized with each bonding blade of the placement and bonding head of FIG. 3.

Referring now to FIG. 4, there is depicted a schematic view of a control circuit which may be utilized with each thermally activatable blade 58 of placement and bonding head 28. As is illustrated, the control circuit depicted within FIG. 4 includes a pair of inverters 72 which preferably receive an alternating series of pulse width modulated pulses. These pulses are preferably generated by thermode control circuitry (see FIG. 1) and are controlled by direct feedback generated from the output of each thermocouple 66 (see FIG. 3). The pulses applied to inverters 54 are then utilized to directly control the base drive of a pair of Darlington transistors 74. Current will flow into the base of each Darlington transistor 74 from the illustrated 5 volt power supply in response to a high output an inverter 72. When either Darlington transistor 74 is rendered conductive, current will flow from the 32 volt supply through transformer coil 54 and return through a transistor 74 to ground.

In a preferred embodiment of the present invention, the pulse signals applied to inverters 72 are TTL signals and are negative true logic signals so that the analog driver will be in the "off" state after the controller is powered on. After power-on-reset all output ports of the drive circuitry are at "high" TTL levels. This will turn all transistors off. If positive true logic were utilized, it would be possible to damage Darlington transistors 74 by driving large currents through those transformers, if the 32 volt power supply were inadvertently turned on prior to initializing the control circuitry.

Darlington transistors 74 are merely utilized as switching transistors and no attempt is made to control the current magnitude by operating these devices anywhere near the linear region. If any significant collector-emitter voltage were allowed, Darlington transistor 74 would undoubtedly consume excessive power and would probably fail. In actual practice, it has been discovered that the duty cycle of Darlington transistors 74 is sufficiently low so that no heat sinks are required. Of course, those skilled in the art will appreciate that if the cycle time of the system disclosed herein is significantly reduced or the energy requirements such that this duty cycle must increase dramatically, then heat sinks should be provided.

In a preferred embodiment of the present invention, the drive pulses applied to inverters 72 are preferably a series of 88 microsecond duration pulses which alternate between top and bottom Darlington transistor 74. Between each 88 microsecond "on" pulse is a 12 microsecond "off" time. The total time for a cycle between the top and bottom transistors is then 500 microseconds. A 500 microsecond period results in a 5 kilohertz signal. By utilizing a frequency of 5 kilohertz or higher, the transformers formed by each transformer coil 54 and an associated housing arm 52 will not saturate. If a driver frequency slower than 5 kilohertz is utilized, current through the resultant transformers will sharply increase and damage to the driver circuitry will undoubtedly occur.

In operation during bonding, the output of each thermocouple 66 is utilized to repeatedly determine the temperature of the four heat activatable blades 58. The amount of difference between the desired bonding temperature and the maximum temperature attained for each heat activatable blade 58 during a particular bond cycle is then utilized to pulse width modulate the control waveforms which are applied to inverters 72. In this manner, the amount of power applied to each thermally activatable blade 58 may be accurately and efficiently controlled.

Figure 5A:
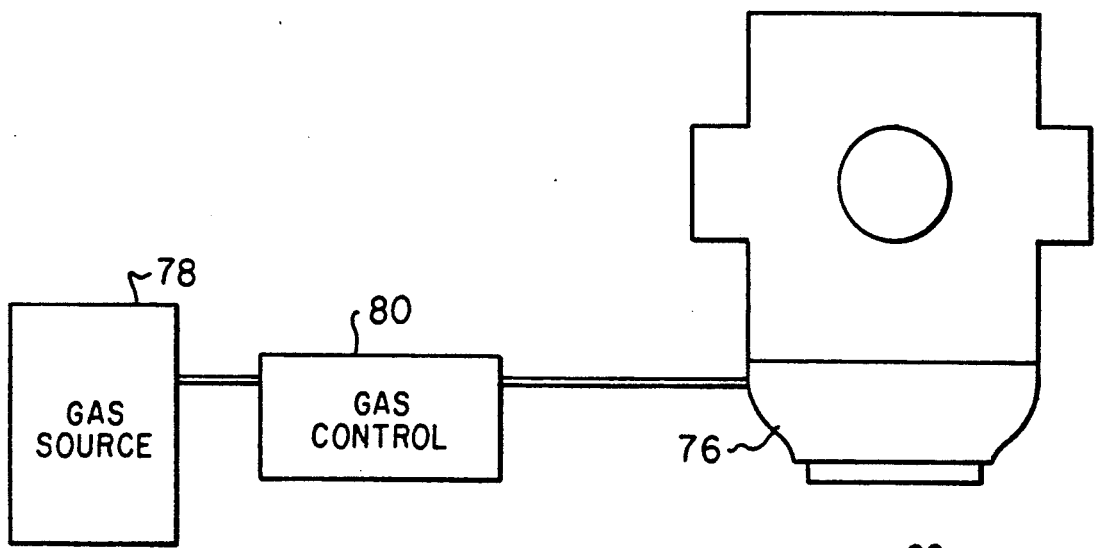
FIGS. 5a and 5b are schematic representations of a side view and bottom view, respectively, of an alternate embodiment of the placement and bonding head of the system of FIG. 1.
Figure 5B:
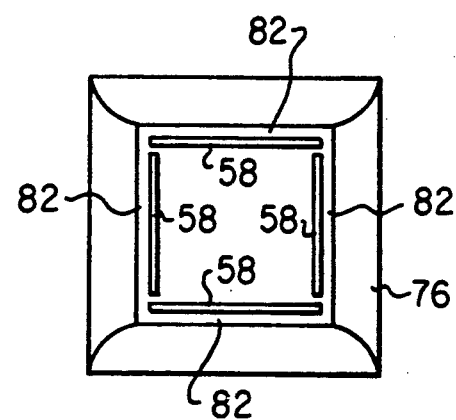

Finally, with reference now to FIGS. 5a and 5b, there is depicted a schematic representation of a side view and bottom view, respectively, of an alternate embodiment of placement and bonding head 28 of the system of FIG. 1. As is illustrated, placement and bonding head 28, as illustrated in FIG. 5a includes a plenum 76 which surrounds thermally activatable blades 58. Plenum 76 preferably includes a cavity which is coupled, via gas control 80, to gas source 78. Gas source 78 is preferably a supply of nitrogen or a combination of nitrogen and hydrogen and is applied to the bonding site in order to obviate the requirement of utilizing flux to achieve a reliable bond.

As the pitch for electronic components which are applied with such systems decreases, the process by which flux is cleaned from the circuit board after bonding has occurred becomes increasingly difficult. By applying a supply of an inert gas, such as nitrogen, to the bonding site, the necessity of utilizing flux is eliminated. Thus, a gas source 78, which encloses a volume of nitrogen, is coupled to plenum 76 by means of gas control 80. As illustrated in the bottom view contained within FIG. 5b, gas is caused to flow out of aperture 82 onto the bond site during the activation of thermally activatable blades 58. As a result, an accurate and reliable bond of an electronic component to a plurality of contact pads on a circuit board is achieved without the necessity of applying flux or removing the flux after bonding has occurred.

Upon reference to the foregoing, those skilled in the art will appreciate that the Applicants in the present application have developed a novel technique whereby an electronic component may be grasped, inspected, accurately placed at a desired location on a circuit board, and then bonded to that location without the necessity of handling the component more than once. Further, by permitting the individual temperature of each thermally activatable blade 58 to be controlled separately, variations in thermal load which are experienced by each blade are effectively eliminated as a source of bonding errors. In this manner, the system of the present invention permits a highly efficient and accurate assemblage of electronic systems utilizing robotic techniques.

While the invention has been particularly shown and described with reference to a preferred embodiment, it will be understood by those skilled in the art that various changes in form and detail may be made therein without departing from the spirit and scope of the invention.

We claim:

1. A system for placing an electronic component having a plurality of conductive leads onto a plurality of contact pads on a circuit board and bonding said electronic component thereto, said system comprising:
   a manipulatable robotic arm adapted to be selectively moved about within a work space containing a circuit board;
   a placement head selectively and temporarily mounted to said manipulatable robotic arm for placing an electronic component on said circuit board;
   means for selectively retaining said electronic component within said placement head;
   bonding means contained within said placement head for thermally bonding said electronic component to said circuit board while said electronic component is retained within said placement head, said bonding means comprising a plurality of thermally activatable blades fixedly mounted within said placement head adjacent to said plurality of conductive leads of said electronic component when said electronic component is retained within said placement head; and
   a plurality of thermal detectors, each of said plurality of thermal detectors mounted adjacent to an associated one of said plurality of thermally activatable blades.

2. The system for placing an electronic component having a plurality of conductive leads onto a plurality of contact pads on a circuit board and bonding said electronic component thereto according to claim 1, further including a plurality of control circuits, each control circuit coupled to one of said plurality of thermal detectors and an associated one of said plurality of thermally activatable blades for supplying current to a thermally activatable blade wherein the temperature of each of said plurality of thermally activatable blades may be individually controlled to compensate for variations in thermal conductivity in the vicinity thereof.

3. The system for placing an electronic component having a plurality of conductive leads onto a plurality of contact pads on a circuit board and bonding said electronic component thereto according to claim 2, further including a plurality of current amplification devices mounted within said placement head, each of said plurality of current amplification devices coupled to an associated one of said plurality of thermally activatable blades.

4. The system for placing an electronic component having a plurality of conductive leads onto a plurality of contact pads on a circuit board and bonding said electronic component thereto according to claim 3, wherein each of said plurality of control circuits provides a low level supply current to be coupled to said placement head and a selected one of said plurality of current amplification devices wherein said placement head may be selectively and temporarily mounted to said manipulatable robotic arm utilizing low current connections.

5. The system for placing an electronic component having a plurality of conductive leads onto a plurality of contact pads on a circuit board and bonding said electronic component thereto according to claim 3, wherein each of said plurality of current amplification devices mounted within said placement head comprises a transformer.

6. The system for placing an electronic component having a plurality of conductive leads onto a plurality of contact pads on a circuit board and bonding said electronic component thereto according to claim 5, wherein the primary of each of said transformers comprises a center-tapped torodial transformer coil.

7. The system for placing an electronic component having a plurality of conductive leads onto a plurality of contact pads on a circuit board and bonding said electronic component thereto according to claim 2, wherein the output of each of said plurality of control circuits comprises a pulse width modulated control signal wherein the amount of current provided to a selected one of said plurality of thermally activatable blades may be controlled by varying the pulse width of said pulse width modulated control signal.

8. A device for bonding an electronic component having a plurality of conductive leads to a plurality of conductive pads on a circuit board, said device comprising:
   a bonding head having a cavity adapted to receive an electronic component;

a plurality of thermally activatable blades mounted within said bonding head adjacent to said cavity and adapted to bond a plurality of conductive leads to a plurality of contact pads upon activation thereof;

a plurality of thermal detectors, each of said plurality of thermal detectors mounted adjacent to and associated one of said plurality of thermally activatable blades; and a plurality of control circuits, each control circuit coupled to one of said plurality of thermal detectors and an associated one of said plurality of thermally activatable blades for supplying current to a thermally activatable blade wherein the temperature of said plurality of the thermally activatable blades may be individually controlled to compensate for variations in thermal conductivity in the vicinity thereof.

9. The device for bonding an electronic component having a plurality of conductive leads to a plurality of contact pads on a circuit board according to claim 8, further including means for selectively maintaining an electronic component within said cavity.

10. The device for bonding an electronic component having a plurality of conductive leads to a plurality of contact pads on a circuit board according to claim 9, wherein said means for selectively maintaining an electronic component within said cavity comprises a vacuum chuck within said cavity and a selective source of vacuum adapted to be applied thereto.

11. The device for bonding an electronic component having a plurality of conductive leads to a plurality of contact pads on a circuit board according to claim 8, further including a plenum mounted within said bonding head adjacent to said plurality of thermally activatable blades and means for controlling the coupling of a supply of an inert gas to said plenum wherein said bonding may occur without the necessity of utilizing flux.

12. The device for bonding an electronic component having a plurality of conductive leads to a plurality of contact pads on a circuit board according to claim 11, wherein said supply of an inert gas comprises a supply of nitrogen.

* * * * *